United States Patent
Kim

(10) Patent No.: US 12,300,470 B2
(45) Date of Patent: May 13, 2025

(54) SUBSTRATE TREATING APPARATUS HAVING EDGE IMPEDANCE CONTROL CIRCUIT

(71) Applicant: SEMES CO., LTD., Cheonan-si (KR)

(72) Inventor: Daehyun Kim, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 140 days.

(21) Appl. No.: 17/379,948

(22) Filed: Jul. 19, 2021

(65) Prior Publication Data
US 2022/0028664 A1    Jan. 27, 2022

(30) Foreign Application Priority Data
Jul. 24, 2020  (KR) .................. 10-2020-0092021

(51) Int. Cl.
*H01J 37/32* (2006.01)
*H01L 21/687* (2006.01)

(52) U.S. Cl.
CPC .. *H01J 37/32697* (2013.01); *H01J 37/32082* (2013.01); *H01L 21/68735* (2013.01); *H01J 2237/3343* (2013.01)

(58) Field of Classification Search
CPC ........... H01L 21/6831; H01L 21/67063; H01L 21/67103; H01L 21/67109;
(Continued)

(56) References Cited

U.S. PATENT DOCUMENTS 6,270,618 B1 * 8/2001 Nakano ............ H01J 37/32174
204/298.34
6,753,689 B1 * 6/2004 Thomas ............ H01J 37/32082
118/712
(Continued)

FOREIGN PATENT DOCUMENTS

JP    2009164608    7/2009
JP    2020-96176    6/2020
(Continued)

OTHER PUBLICATIONS

Yohei Yamazawa, et al., Control of the Harmonics Generation in a Capacitively Coupled Plasma Reactor, Japanese Journal of Applied Physics. vol. 46, No. 11, 2007, pp. 7453-7459.
(Continued)

*Primary Examiner* — Kurt Sweely
*Assistant Examiner* — Joshua Reyes

(57) ABSTRACT

A substrate treating apparatus is disclosed. The apparatus includes a process chamber having a treating space defined therein, a support unit for supporting a substrate in the treating space, a gas supply unit for supplying process gas into the treating space, and an RF power source for supplying an RF signal to excite the process gas to a plasma state, wherein the support unit includes an edge ring surrounding the substrate, a coupling ring disposed below the edge ring and including an electrode therein, and an edge impedance control circuit connected to the electrode wherein the edge impedance control circuit includes a harmonics control circuit unit for controlling harmonics caused by the RF power source, and an ion flux control circuit unit for controlling an ion flux in an edge region of the substrate.

9 Claims, 6 Drawing Sheets

(58) Field of Classification Search
CPC .......... H01L 21/68721; H01L 21/68735; H01J 37/321; H01J 37/32082; H01J 37/32155; H01J 37/32165; H01J 37/32174; H01J 37/32385; H01J 37/32642; H01J 37/32697; H01J 2237/3343; C23C 16/245; C23C 16/505
See application file for complete search history.

(56) References Cited

U.S. PATENT DOCUMENTS

| | | | |
|---|---|---|---|
| 7,780,814 B2* | 8/2010 | Pipitone | H01J 37/321 |
| | | | 156/345.46 |
| 8,858,816 B2 | 10/2014 | Godet et al. | |
| 8,920,611 B2* | 12/2014 | Forster | H01J 37/34 |
| | | | 156/345.43 |
| 2008/0179011 A1* | 7/2008 | Collins | H01L 21/6831 |
| | | | 156/345.43 |
| 2009/0229969 A1* | 9/2009 | Hoffman | C23C 14/50 |
| | | | 204/192.12 |
| 2010/0258529 A1 | 10/2010 | Mori | |
| 2015/0076112 A1* | 3/2015 | Sriraman | H01J 37/32422 |
| | | | 156/345.28 |
| 2016/0244874 A1* | 8/2016 | Ge | C23C 14/54 |
| 2018/0102238 A1* | 4/2018 | Gu | H01J 37/32715 |
| 2019/0035666 A1* | 1/2019 | Lim | H01L 21/6831 |
| 2019/0304754 A1* | 10/2019 | Shim | H01J 37/32642 |
| 2019/0333741 A1* | 10/2019 | Nagami | H01J 37/32091 |
| 2020/0152427 A1* | 5/2020 | Lee | H01J 37/32174 |
| 2020/0204143 A1* | 6/2020 | Kim | H01J 37/32091 |

FOREIGN PATENT DOCUMENTS

| | | |
|---|---|---|
| KR | 1020050089976 | 9/2005 |
| KR | 1020180000291 | 1/2018 |
| KR | 1020180003997 | 1/2018 |
| KR | 10-2018-0038596 | 4/2018 |
| KR | 1020190086679 | 7/2019 |
| TW | I451468 | 9/2014 |

OTHER PUBLICATIONS

Office Action from the Taiwan Intellectual Property Office dated Oct. 3, 2022.
Notice of allowance dated from the Japan Patent Office Aug. 30, 2022.
Office Action from the China National Intellectual Property Administration dated Jul. 28, 2023.
Office Action from the Korean Intellectual Property Office dated Aug. 23, 2023.

* cited by examiner

SUBSTRATE TREATING APPARATUS HAVING EDGE IMPEDANCE CONTROL CIRCUIT

CROSS-REFERENCE TO RELATED APPLICATIONS

A claim for priority under 35 U.S.C. § 119 is made to Korean Patent Application No. 10-2020-0092021 filed on Jul. 24, 2020, in the Korean Intellectual Property Office, the entire contents of which are hereby incorporated by reference.

BACKGROUND

Embodiments of the inventive concept described herein relate to a substrate treating apparatus and a substrate treating method. More particularly, embodiments of the inventive concept described herein relate to a substrate treating apparatus and a substrate treating method capable of controlling harmonics generated in a substrate treating process and simultaneously performing ion direction control of an edge region.

In order to manufacture a semiconductor element, various processes such as photolithography, etching, ashing, ion implantation, thin film deposition, and cleaning are performed on a substrate to form a desired pattern on the substrate. The etching process removes a selected heated region from a film formed on the substrate, and includes wet etching and dry etching. An etching device using plasma is used for the dry etching.

In general, in order to generate plasma, an electromagnetic field is generated in an inner space of a process chamber, and the electromagnetic field excites a process gas provided to the process chamber into a plasma state. The plasma refers to an ionized gas state composed of ions, electrons, and radicals. The plasma is generated using extremely high temperature, strong electric fields, or RF electromagnetic fields.

As the etching process proceeds, a ion flux direction of an edge region is changed due to etching of an edge ring, thereby deteriorating uniformity of a process, and reducing a yield. In addition, harmonics generated due to the plasma increase a plasma density of a central region, thereby causing an imbalance in an etching amount between center and edge regions.

In a conventional process, in order to solve the problem that the ion flux direction of the edge region is changed due to the etching of the edge ring, RF plasma of the edge region is coupled to the edge ring using a coupling ring disposed under the edge ring, and the ion flux direction of the edge region is controlled using a variable element included in a RF filter. In this connection, non-linearity of a plasma sheath causes the imbalance in the etching amount between the center and edge regions. In the conventional design process, there was a problem that a harmonics signal, especially, a third harmonic signal was not considered.

SUMMARY

Embodiments of the inventive concept provide a substrate treating apparatus and a substrate treating method capable of improving etching uniformity and increasing a use time of an edge ring by performing both ion direction control and harmonics control.

Purposes according to the inventive concept are not limited to the above-mentioned purpose. Other purposes and advantages according to the inventive concept that are not mentioned may be understood based on following descriptions, and may be more clearly understood based on embodiments according to the inventive concept. Further, it will be easily understood that the purposes and advantages according to the inventive concept may be realized using means shown in the claims and combinations thereof.

A substrate treating apparatus according to an embodiment of the inventive concept is disclosed.

According to an embodiment, a substrate treating apparatus may include a process chamber having a treating space defined therein, a support unit for supporting a substrate in the treating space, a gas supply unit for supplying process gas into the treating space, and an RF power source for supplying an RF signal to excite the process gas to a plasma state, wherein the support unit may include an edge ring surrounding the substrate, a coupling ring disposed below the edge ring and including an electrode therein, and an edge impedance control circuit connected to the electrode wherein the edge impedance control circuit may include a harmonics control circuit unit for controlling harmonics caused by the RF power source, and an ion flux control circuit unit for controlling an ion flux in an edge region of the substrate.

According to one example, the harmonics control circuit unit may include a first variable capacitor, wherein the ion flux control circuit unit may include a second variable capacitor.

According to one example, the ion flux control circuit unit further may include at least one band stop filter.

According to one example, the band stop filter may be disposed between the harmonics control circuit unit and the second variable capacitor.

According to one example, the band stop filter may block a frequency range in which a harmonics signal generated from the RF power source is blocked.

According to one example, the harmonics control circuit unit and the ion flux control circuit unit may be connected in parallel to each other.

According to one example, the first variable capacitor of the harmonics control circuit unit may be adjusted to control a third harmonic caused by the RF power source, wherein the second variable capacitor of the ion flux control circuit unit may be adjusted to control an impedance of the edge ring such that an ion trajectory is uniform.

According to one example, the harmonics control circuit unit may be closer to the electrode than the ion flux control circuit unit may be.

According to one example, the apparatus may further include an insulator disposed between the edge ring and the coupling ring.

A substrate treating apparatus according to another embodiment of the inventive concept is disclosed.

According to another embodiment, a substrate treating apparatus may include a process chamber having a treating space defined therein, a support unit for supporting a substrate in the treating space, a gas supply unit for supplying process gas into the treating space, and an RF power source for supplying an RF signal to excite the process gas to a plasma state, wherein the support unit may include an edge ring surrounding the substrate, a coupling ring disposed below the edge ring and including an electrode therein, a harmonics control circuit unit including a first variable capacitor, and an ion flux control circuit unit including a second variable capacitor, wherein the ion flux control circuit unit may include at least one band stop filter disposed between the harmonics control circuit unit and the second variable capacitor.

According to one example, a distal end of the harmonics control circuit unit may be connected to a ground, wherein the harmonics control circuit unit may be connected in parallel with the ion flux control circuit unit.

According to one example, a distal end of the ion flux control circuit unit may be connected to a ground, wherein the at least one band stop filter and the second variable capacitor may be connected in series with each other.

According to one example, the at least one band stop filter may block a frequency range in which a harmonics signal generated from the RF power source is blocked during an operation of the ion flux control circuit unit.

According to one example, a frequency blocked by the at least one band stop filter blocks may be 60 MHz or 180 MHz.

A substrate treating method according to another embodiment of the inventive concept is disclosed.

According to another embodiment, a method for treating a substrate using the substrate treating apparatus, the apparatus generates plasma inside the process chamber, wherein the method may include adjusting the ion flux control circuit unit to control a direction of an ion flux, and adjusting an etching rate in a central portion of the substrate using the harmonics control circuit unit.

According to one example, the adjusting of the ion flux control circuit unit to control the direction of the ion flux may include using the band stop filter to block harmonics.

According to one example, the adjusting of the ion flux control circuit unit to control the direction of the ion flux may include adjusting the second variable capacitor to control the direction of the ion flux, wherein the adjusting of the etching rate in the central portion of the substrate using the harmonics control circuit unit may include adjusting the first variable capacitor to adjust the etching rate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
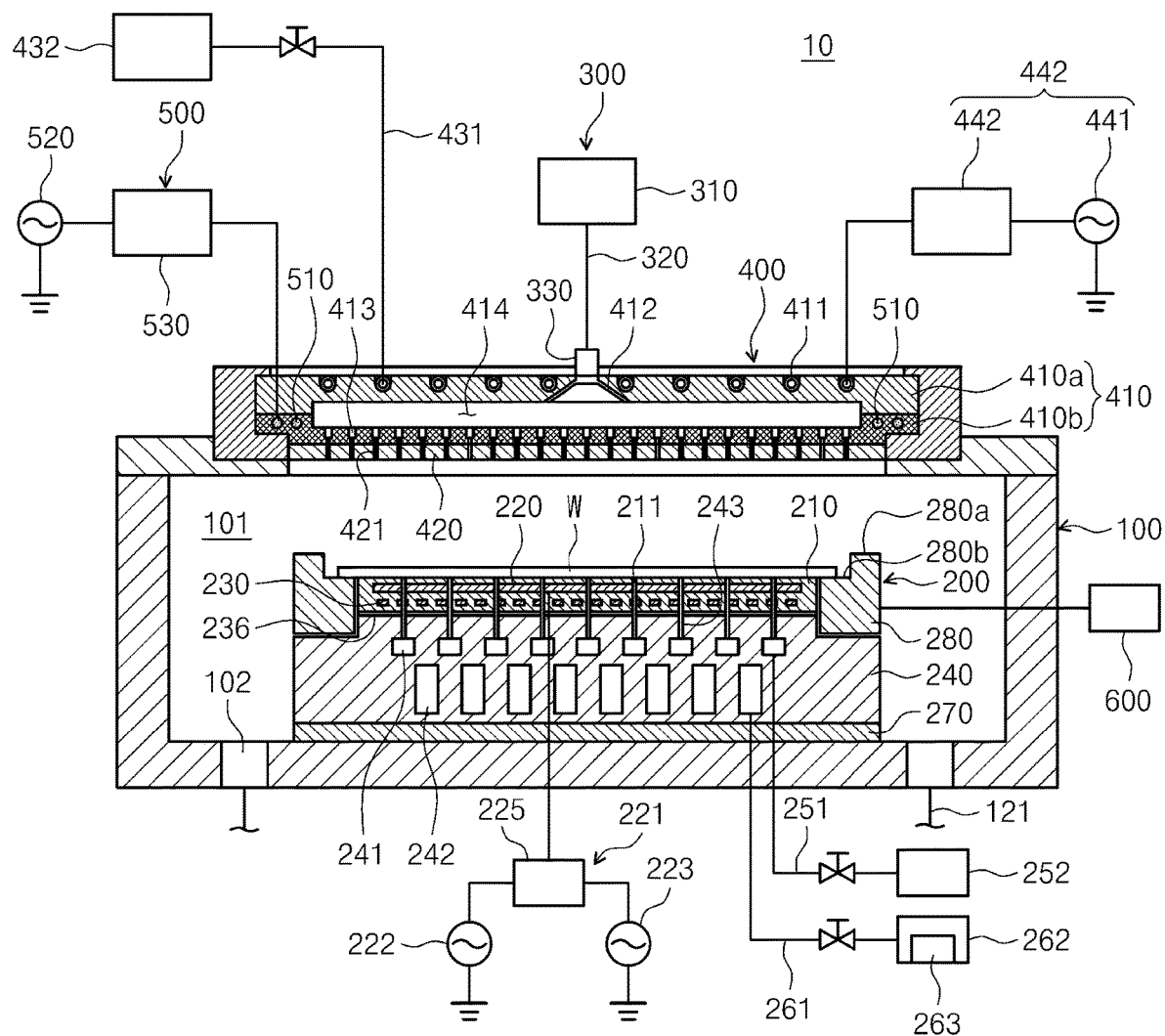
FIG. 1 is an exemplary diagram showing a substrate treating apparatus according to one embodiment of the inventive concept.

Advantages and features of the inventive concept, and a method of achieving them will become apparent with reference to embodiments described below in detail together with the accompanying drawings. However, the inventive concept is not limited to the embodiments disclosed below, but may be implemented in various different forms. The present embodiments are provided to merely complete the disclosure of the inventive concept, and to merely fully inform those skilled in the art of the inventive concept of the scope of the inventive concept. The inventive concept is only defined by the scope of the claims.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing the embodiments only and is not intended to limit the inventive concept. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or greater other features, integers, operations, elements, components, and/or portions thereof. Like reference numerals refer to like elements throughout the disclosure. As used herein, the term "and/or" includes any and all combinations of one or more of the associated listed items.

Although terms "first", "second", etc. are used to describe various components, it goes without saying that the components are not limited by these terms. These terms are only used to distinguish one component from another component. Therefore, it goes without saying that a first component as mentioned below may be a second component within a technical idea of the inventive concept.

A shape, a size, a ratio, an angle, a number, etc. disclosed in the drawings for describing an embodiments of the inventive concept are exemplary, and the inventive concept is not limited thereto.

As used herein, '~ unit' and '~ module' may refer to means for processing at least one function or operation, and may refer to, for example, software, or a hardware component such as FPGA or ASIC. However, '~ unit' and '~ module' may not be limited to the software or the hardware. '~ unit' and '~module' may be configured to reside on an addressable storage medium and may be configured to reproduce one or more processors.

In an example, '~ unit' and '~ module' may refer to components such as software components, object-oriented software components, class components and task components, processes, functions, properties, procedures, subroutines, segments of a program code, drivers, firmware, microcode, a circuit, data, database, data structures, tables, arrays, and variables. A function provided by a component, '~ unit' or '~ module' may be performed in a separate manner using a plurality of components, a plurality of '~ units' or a plurality of '~ modules'. A component, '~ unit' or '~ module' may be integrated with an additional component.

FIG. 1 is an exemplary diagram illustrating a substrate treating apparatus 10 according to one embodiment of the inventive concept.

Referring to FIG. 1, the substrate treating apparatus 10 treats a substrate W using plasma. For example, the substrate treating apparatus 10 may perform an etching process on the substrate W. The substrate treating apparatus 10 includes a chamber 100, a substrate support unit 200, a gas supply unit 300, a plasma generation unit 400, and a heating unit 500.

The chamber 100 has an inner space 101 defined therein. The inner space 101 acts as a space in which a plasma process treating is carried out on the substrate W. The plasma treating on the substrate W includes an etching process. An exhaust hole 102 is formed in a bottom face of the chamber 100. The exhaust hole 102 is connected to an exhaust line 121. Reaction by-products generated during the process and gas staying in the chamber 100 may be discharged to an outside through the exhaust line 121. The inner space 101 of the chamber 100 is decompressed to a predefined pressure via an exhaust process.

The substrate support unit 200 is located inside the chamber 100. The substrate support unit 200 supports the substrate W. The substrate support unit 200 includes an electrostatic chuck that sucks and fixes the substrate W using an electrostatic force. The substrate support unit 200 may include a dielectric plate 210, a lower electrode 220, a heater 230, a support plate 240, and an electrically-insulating plate 270.

The dielectric plate 210 is located on an upper end of the substrate support unit 200. The dielectric plate 210 acts as a disk-shaped dielectric plate. The substrate W may be disposed on a top face of the dielectric plate 210. The top face of the dielectric plate 210 has a smaller radius than that of the substrate W. Therefore, an edge region of the substrate W is located out of the dielectric plate 210. A first supply channel 211 is formed in the dielectric plate 210. The first supply channel 211 extends from the top face of the dielectric plate 210 to a bottom face thereof. A plurality of first supply channels 211 are spaced apart from each other, and are provided as a passage through which a heat-transfer medium is supplied to a bottom face of the substrate W. A separate electrode for sucking the substrate W to the dielectric plate 210 may be embedded in the dielectric plate 210. A direct current may be applied to the electrode. An electrostatic force acts between the electrode and the substrate under the applied current, such that the substrate W may be sucked to the dielectric plate 210 via the electrostatic force.

The lower electrode 220 is connected to a lower power supply 221. The lower power supply 221 applies power to the lower electrode 220. The lower power supply 221 includes lower RF power sources 222 and 223 and a lower impedance matching unit 225. A plurality of lower RF power sources 222 and 223 may be provided as shown in FIG. 1, or alternatively, only one lower RF power source may be provided. The lower RF power sources 222 and 223 may control a plasma density. The lower RF power sources 222 and 223 mainly control ion bombardment energy. The plurality of lower RF power sources 222 and 223 may generate frequency power of 2 Mhz and 13.56 Hz, respectively. The lower impedance matching unit 225 is electrically connected to the lower RF power sources 222 and 223, and matches frequency powers of different magnitudes with each other and applies the matched frequency powers to the lower electrode 220.

The heater 230 is electrically connected to an external power source (not shown). The heater 230 generates heat by resisting against current applied from the external power source. The generated heat is transferred to the substrate W via the dielectric plate 210. The substrate W is maintained at a predefined temperature using the heat generated by the heater 230. The heater 230 includes a spiral coil. A plurality of heaters 230 may be embedded in the dielectric plate 210 and be spaced from each other by a uniform spacing.

The support plate 240 is located under the dielectric plate 210. A bottom face of the dielectric plate 210 and a top face of the support plate 240 may be bonded to each other via an adhesive 236. The support plate 240 may be made of an aluminum material. The top face of the support plate 240 may be stepped so that a central region thereof is higher than an edge region thereof. The central region of the top face of the support plate 240 has an area corresponding to an area of the bottom face of the dielectric plate 210, and is adhered to the bottom face of the dielectric plate 210. A first circulating channel 241, a second circulating channel 242, and a second supply channel 243 are formed in the support plate 240.

The first circulating channel 241 acts as a passage along which the heat-transfer medium circulates. The first circulating channel 241 may be formed in a spiral shape and inside the support plate 240. Alternatively, the first circulating channel 241 may be constructed so that ring-shaped channels having different radii may be arranged around the same center. The first circulating channels 241 may communicate with each other. The first circulating channels 241 may be located at the same vertical level.

The second circulating channel 242 serves as a passage along which a cooling fluid circulates. The second circulating channel 242 may be formed in a spiral shape and inside the support plate 240. Alternatively, the second circulating channel 242 may be constructed such that ring-shaped channels having different radii may be arranged around the same center. The second circulating channels 242 may communicate with each other. The second circulating channel 242 may have a larger cross-sectional area than that of the first circulating channel 241. The second circulating channels 242 may be located at the same vertical level. The second circulating channel 242 may be located below the first circulating channel 241.

The second supply channel 243 extends upward from the first circulating channel 241 and extends to a top face of the support plate 240. A plurality of the second supply channels 243 are provided such that the number thereof corresponds to the number of the first supply channels 211. The second supply channel 243 connects the first circulating channel 241 and the first supply channel 211 to each other.

The first circulating channel 241 is connected to a heat-transfer medium storage 252 via a heat-transfer medium supply line 251. The heat-transfer medium storage 252 stores a heat-transfer medium therein. The heat-transfer medium includes an inert gas. According to an embodiment, the heat-transfer medium includes helium (He) gas. The helium gas is supplied to the first circulating channel 241 through the supply line 251, and sequentially flows through the second supply channel 243 and the first supply channel 211 and then is supplied to the bottom face of the substrate W. The helium gas acts as a medium via which heat transferred from the plasma to the substrate W is transferred to the substrate support unit 200. Ionic particles contained in the plasma are attracted using an electric force generated in the substrate support unit 200 and travel to the substrate support unit 200, and collide with the substrate W during the travel to perform an etching process. As the ionic particles collide with the substrate W, the heat is generated in the substrate W. The heat generated from the substrate W is transferred to the substrate support unit 200 via the helium gas supplied to a space between the bottom face of the substrate W and the top face of the dielectric plate 210. Thus, the substrate W may be maintained at a set temperature.

The second circulating channel 242 is connected to a cooling fluid storage 262 via a cooling fluid supply line 261. The cooling fluid storage 262 stores cooling fluid therein. A cooler 263 may be provided within the cooling fluid storage 262. The cooler 263 cools the cooling fluid to a predefined temperature. Alternatively, the cooler 263 may be installed on the cooling fluid supply line 261. The cooling fluid supplied to the second circulating channel 242 through the cooling fluid supply line 261 circulates along the second circulating channel 242 and cools the support plate 240. The cooling of the support plate 240 cools the dielectric plate 210 and the substrate W together to maintain the substrate W at a predefined temperature.

The electrically-insulating plate 270 is provided under the support plate 240. The electrically-insulating plate 270 has a size corresponding to that of the support plate 240. The electrically-insulating plate 270 is located between the support plate 240 and a bottom face of the chamber 100. The electrically-insulating plate 270 is made of an insulating material, and electrically insulates the support plate 240 and the chamber 100 from each other.

An edge ring 280 is disposed in an edge region of the substrate support unit 200. The edge ring 280 has a ring shape and extends along a periphery of the dielectric plate 210. A top face of the edge ring 280 may be stepped so that an outer portion 280a thereof may be higher than an inner portion 280b thereof. The inner portion 280b of the top face of the edge ring 280 is positioned at the same vertical level as that of the top face of the dielectric plate 210. The inner portion 280b of the top face of the edge ring 280 supports the edge region of the substrate W positioned out of the dielectric plate 210. The outer portion 280a of the edge ring 280 is provided to surround the edge region of the substrate W. The edge ring 280 expands an electric field generated region so that the substrate W is located at a center of a plasma generated region. Thus, the plasma is uniformly generated over an entire area of the substrate W, so that the regions of the substrate W may be etched uniformly. A coupling ring (not shown) may be disposed below the edge ring 280. An edge impedance control circuit 600 connected to the coupling ring may perform direction control of the ion flux and may control the harmonics generated from the RF power sources 441, 222, and 223. A detailed description thereof will be described later with reference to FIG. 2.

The gas supply unit 300 supplies a process gas to the chamber 100. The gas supply unit 300 includes a gas storage 310, a gas supply line 320, and a gas inlet port 330. The gas supply line 320 connects the gas storage 310 and the gas inlet port 330 to each other, and supplies the process gas stored in the gas storage 310 to the gas inlet port 330. The gas inlet port 330 is connected to gas supply holes 412 formed in an upper electrode 410.

The plasma generation unit 400 excites the process gas remaining inside the chamber 100. The plasma generation unit 400 includes the upper electrode 410, a distribution plate 420, and an upper power supply 440.

The upper electrode 410 has a shape of a disk, and is located above the substrate support unit 200. The upper electrode 410 includes an upper plate 410a and a lower plate 410b. The upper plate 410a has a disk shape. The upper plate 410a is electrically connected to an upper RF power source 441. The upper plate 410a excites the process gas by applying a first RF power generated from the upper RF power source 441 to the process gas staying in the chamber 100. The process gas is excited and converted to a plasma state. A bottom face of upper plate 410a is stepped so that a central region thereof is higher than an edge region thereof. The gas supply holes 412 are formed in the central region of the upper plate 410a. The gas supply holes 412 are connected to the gas inlet port 330 and supply the process gas to a buffer space 414. A cooling channel 411 may be formed inside the upper plate 410a. The cooling channel 411 may be formed in a spiral shape. Alternatively, the cooling channel 411 may be constructed so that ring-shaped channels having different radii may be arranged around the same center. The cooling channel 411 is connected to a cooling fluid storage 432 via a cooling fluid supply line 431. The cooling fluid storage 432 stores the cooling fluid therein. The cooling fluid stored in the cooling fluid storage 432 is supplied to the cooling channel 411 via the cooling fluid supply line 431. The cooling fluid circulates along the cooling channel 411 and cools the upper plate 410a.

The lower plate 410b is positioned below the upper plate 410a. The lower plate 410b has a size corresponding to that of the upper plate 410a, and is positioned to face toward the upper plate 410a. A top face of the lower plate 410b is stepped so that a central region thereof is lower than an edge region thereof. The top face of the lower plate 410b and a bottom face of the upper plate 410a are coupled to each other to form the buffer space 414. The buffer space 414 acts as a space where the gas supplied through the gas supply holes 412 temporarily stays before being supplied into the chamber 100. Gas supply holes 413 are formed in the central region of the lower plate 410b. A plurality of gas supply holes 413 are arranged and spaced from each other by a regular spacing. The gas supply holes 413 are connected to the buffer space 414.

The distribution plate 420 is positioned below the lower plate 410b. The distribution plate 420 has a shape of a disk. Distribution holes 421 are formed in the distribution plate 420. The distribution holes 421 extend from a top face of the distribution plate 420 to a bottom face thereof. The number of the distribution holes 421 corresponds to the number of the gas supply holes 413, and the distribution holes 421 are respectively located in positions corresponding to positions where the gas supply holes 413 are located. The process gas staying in the buffer space 414 is uniformly supplied into the chamber 100 via the gas supply holes 413 and the distribution holes 421.

The upper power supply 440 applies RF power to the upper plate 410a. The upper power supply 440 includes the upper RF power source 441 and a matching circuit 442.

The heating unit 500 heats the lower plate 410b. The heating unit 500 includes a heater 510, a second upper power source 520, and a filter 530. The heater 510 is installed inside the lower plate 410b. The heater 510 may be disposed in an edge region of the lower plate 410b. The heater 510 may include a heating coil and may be provided to surround a central region of the lower plate 410b. The second upper power source 520 is electrically connected to the heater 510. The second upper power source 520 may generate DC power. Alternatively, the second upper power source 520 may generate AC power. Second frequency power generated by the second upper power source 520 is applied to the heater 510. Thus, the heater 510 generates heat by resisting against applied current. The heat generated by the heater 510 heats the lower plate 410b, and the heated lower plate 410b heats the distribution plate 420 located below the heated lower plate 410b to a predefined temperature. The lower plate 410b may be heated to a temperature of about 60° C.

The filter 530 is electrically connected to the second upper power source 520 and the heater 510 and is disposed between the second upper power source 520 and the heater 510.

Figure 2:
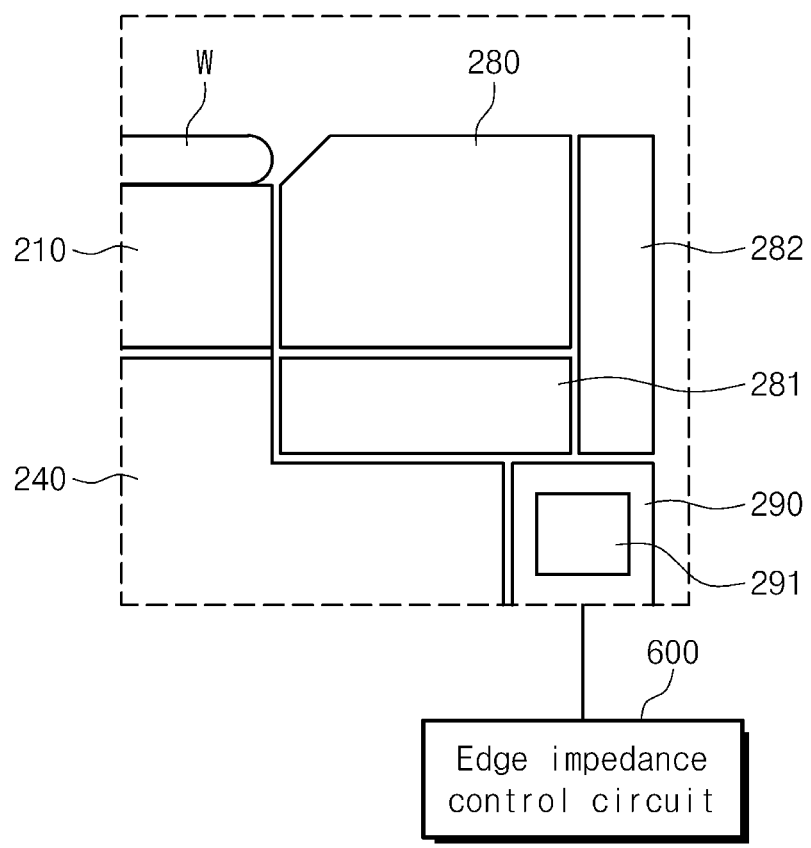
FIG. 2 is an enlarged configuration diagram of a substrate treating apparatus according to one embodiment of the inventive concept.

FIG. 2 is an enlarged configuration diagram of a substrate treating apparatus according to one embodiment of the inventive concept.

The substrate support unit 200 according to the inventive concept may include the edge ring 280 surrounding the substrate W, and a coupling ring 290 disposed below the edge ring 280. Insulators 281 and 282 may be disposed between the edge ring 280 and the coupling ring 290. Two insulators 281 and 282 are provided according to the embodiment of FIG. 2. However, both may be combined into one insulator.

An electrode 291 may be included in the coupling ring 290. The edge impedance control circuit 600 may be connected to the electrode 291 included in the coupling ring 290. The edge impedance control circuit 600 and the internal electrode 291 included inside the coupling ring 290 may be electrically connected to each other via an RF cable (not shown). The edge impedance control circuit 600 may provide an impedance path to a ground for an incoming RF signal in the edge region of the substrate W. The RF signal may flow to the electrode 291 using capacitance between the edge ring 280 and the electrode 291. The electrode 291 may output the RF signal.

According to FIG. 2, controlling variable elements included in the edge impedance control circuit 600 may allow controlling a direction of an ion flux of the edge region of the substrate, and controlling the harmonics generated in the plasma sheath. The harmonics controlled by the edge impedance control circuit 600 may be harmonics above or equal to 100 MHz. This is because a plasma density concentration in the central region is greatly affected at frequencies above or equal to 100 MHz.

Using the edge impedance control circuit 600 according to the inventive concept may allow simultaneously controlling the direction of the ion flux of the edge region and the harmonics generated in the plasma sheath to improve the etching uniformity. Further, an etching imbalance due to the harmonics occurring when only the ion flux of the edge region is considered as in a conventional approach may be removed.

In the conventional approach, the harmonics of frequencies above or equal to 100 MHz were increased or decreased due to an effect of deviation caused by the RF cable connected to the electrode 291 inside the coupling ring, and the edge impedance control circuit connected thereto. Thus, there was a difference in an etching amount between a center region and an edge region of the apparatus, which could not be controlled. In accordance with the inventive concept, the edge impedance control circuit 600 includes a harmonics control circuit unit 610 capable of controlling the harmonics, thereby simultaneously performing the ion flux direction control in the edge region and the harmonics control. Hereinafter, an example of the edge impedance control circuit 600 will be described in more detail based on an example of the edge impedance control circuit 600 shown in FIG. 3 to FIG. 4.

Figure 3:
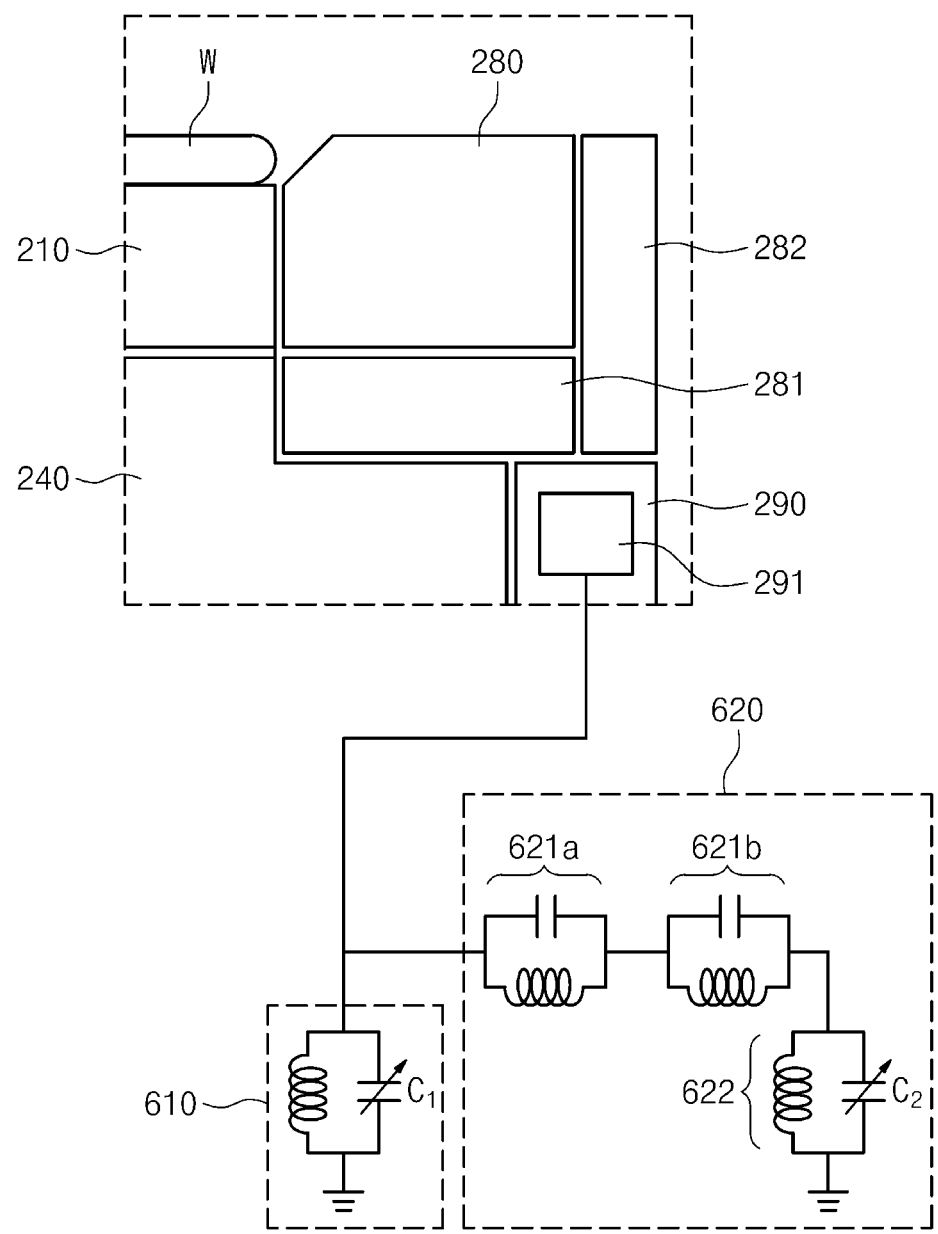
FIG. 3 is a diagram showing an edge impedance control circuit according to an embodiment of the inventive concept.

FIG. 3 is a diagram showing the edge impedance control circuit 600 according to an embodiment of the inventive concept.

Descriptions about configurations in the embodiment of FIG. 3 duplicate with those of FIG. 2 are omitted.

According to FIG. 3, the edge impedance control circuit 600 may include a harmonics control circuit unit 610 and an ion flux control circuit unit 620. The harmonics control circuit unit 610 may include a first variable capacitor C1. The ion flux control circuit unit 620 may include a second variable capacitor C2. The ion flux control circuit unit 620 may include at least one band stop filter 621a and 621b. The band stop filters 621a and 621b may serve to block a specific frequency range. The frequency range blocked by the band stop filters 621a and 621b may be harmonics of the RF power source. Each of the band stop filters 621a and 621b may be embodied as a notch filter. According to one example in FIG. 3, each of the band stop filters 621a and 621b may have a structure in which a capacitor and an inductor are connected in parallel to each other. However, this is only an example. Reactance elements constituting each of the band stop filters 621a and 621b may be combined with each other in various configurations.

The harmonics control circuit unit 610 and the ion flux control circuit unit 620 may be connected in parallel to each other. A distal end of the harmonics control circuit unit 610 may be connected to a ground, and the opposite end thereto of the harmonics control circuit unit 610 may be connected in parallel to at least one band stop filter 621a. A distal end of the ion flux control circuit unit 620 may be connected to a ground. Circuitry 622 including the second variable capacitor C2 included in the ion flux control circuit unit 620 may be connected in series to the at least one band stop filter 621b.

According to one example of FIG. 3, the band stop filters 621a and 621b may be connected in series to each other. Each of the band stop filters 621a and 621b may block harmonics from the plasma sheath. According to one example, when the frequencies generated by the RF power sources are 400 KHz and 60 MHz, the band stop filter 621 is configured such that capacitor and inductor values thereof are set to a range such that 60 MHz and 180 MHz (third harmonic of 60 MHz) are blocked. In this connection, 400 KHz acts as a bias frequency that controls an ion flux directionality in the edge region, and is controlled by the second variable capacitor C2 of the ion flux control circuit unit 620. Influence of the third harmonic of a source frequency 60 MHz is stronger than influence of a second harmonic thereof. Thus, when including the two band stop filters 621a and 621b, a blocking range of the band stop filters 621a and 621b may be set to a range such that the source frequency and the third harmonic are blocked. According to one example, the range of frequencies blocked by the band stop filters 621a and 621b may be primarily harmonics of the RF power source. In this connection, the harmonics may be above or equal to 100 MHz.

However, when three or more band stop filters are included therein, a band stop filter for blocking the second harmonic may also be included therein, and/or a band stop filter for blocking a fourth harmonic may also be included therein. This will be briefly described later based on an embodiment of FIG. 4.

That is, according to the inventive concept, the band stop filters 621 for removing the harmonics may be included in the ion flux control circuit unit 620, so that 180 MHz frequency characteristic of the chamber does not vary when controlling the ion flux direction. When controlling the ion flux direction using the band stop filters 621 for removing the harmonics, an adverse effect of changing an etching rate on the center region resulting from change in characteristics of the third harmonic (180 MHz) of the source frequency 60 MHz may be eliminated.

According to one embodiment of FIG. 3, the harmonics control circuit unit 610 may include the first variable capacitor C1 and an inductor connected in parallel with the first variable capacitor C1. According to one embodiment of FIG. 3, the ion flux control circuit unit 620 may include the second variable capacitor C2 and an inductor connected in parallel with the second variable capacitor C2. However, this is only an example. A specific configuration of each of the harmonics control circuit unit 610 and the ion flux control circuit unit 620 may be different from that of the embodiment of FIG. 3.

According to the inventive concept, adjusting the second variable capacitor C2 included in the ion flux control circuit unit 620 of the edge impedance control circuit 600 may allow a 400 kHz impedance of the edge ring 280 to be changed to control the direction of the ion flux. According to one example, 400 kHz may be an impedance value in the edge ring. A value of the second variable capacitor C2 may be adjusted according to an etching amount of the edge ring 280. The adjustment of the specific value of the second variable capacitor C2 may be determined empirically based on data including a relationship between a use time of the edge ring 280 and the etching amount thereof. The value of the second variable capacitor C2 may be controlled so that the ion flux is incident perpendicularly to the edge ring 280. The first variable capacitor C1 included in the harmonics control circuit unit 610 may be controlled such that a 180 MHz component generated in the plasma may be adjusted such that the etching rate near the center region may be adjusted. The adjustment of the specific value of the first variable capacitor C1 may be determined empirically based on relation data between the etching rate near the center region and the capacitor value. Further, when adjusting the second variable capacitor C2 using at least one band stop filter 621a and 621b included in the ion flux control circuit unit 620, influence of the harmonic component generated in the chamber may be removed while only an impedance component at a lower frequency may be adjusted.

According to one example, when at least one band stop filter 621a and 621b is included in the ion flux control circuit unit 620, the band stop filter 621a for blocking a frequency having a greater influence in a frequency range blocked by the band stop filters 621a and 621b may be disposed closer to the electrode 291. The ion flux direction is controlled using the ion flux control circuit unit 620 because the harmonics control circuit unit 610 is insensitive to a lower frequency, but controls the harmonics and is sensitive to a relatively higher frequency.

According to the edge impedance control circuit 600 in FIG. 3, a plasma RF signal in the edge region may be coupled to the edge ring 280 using the coupling ring 290, while the ion flux direction in the edge region may be controlled via the adjustment of the second variable capacitor C2 included in the ion flux control circuit unit 620 of the edge impedance control circuit 600. According to the edge impedance control circuit 600 in FIG. 3, the etching uniformity may be improved by controlling a harmonics plasma density using the harmonics control circuit unit 610. According to one example, the harmonics controlled using the harmonics control circuit unit 610 may be the third harmonic.

The conventional technique for adjusting the direction of the ion flux in the edge region did not consider 60 MHz harmonics. Thus, as the ion flux in the edge region was adjusted using a variable element, an amount of harmonics generated in the plasma was changed, which caused a side effect of changing a process etching rate. However, the inventive concept has the effect of controlling the change in the process etching rate by adjusting the amount of the harmonics (180 MHz) using the variable element included in the harmonics control circuit unit 610.

Figure 4:
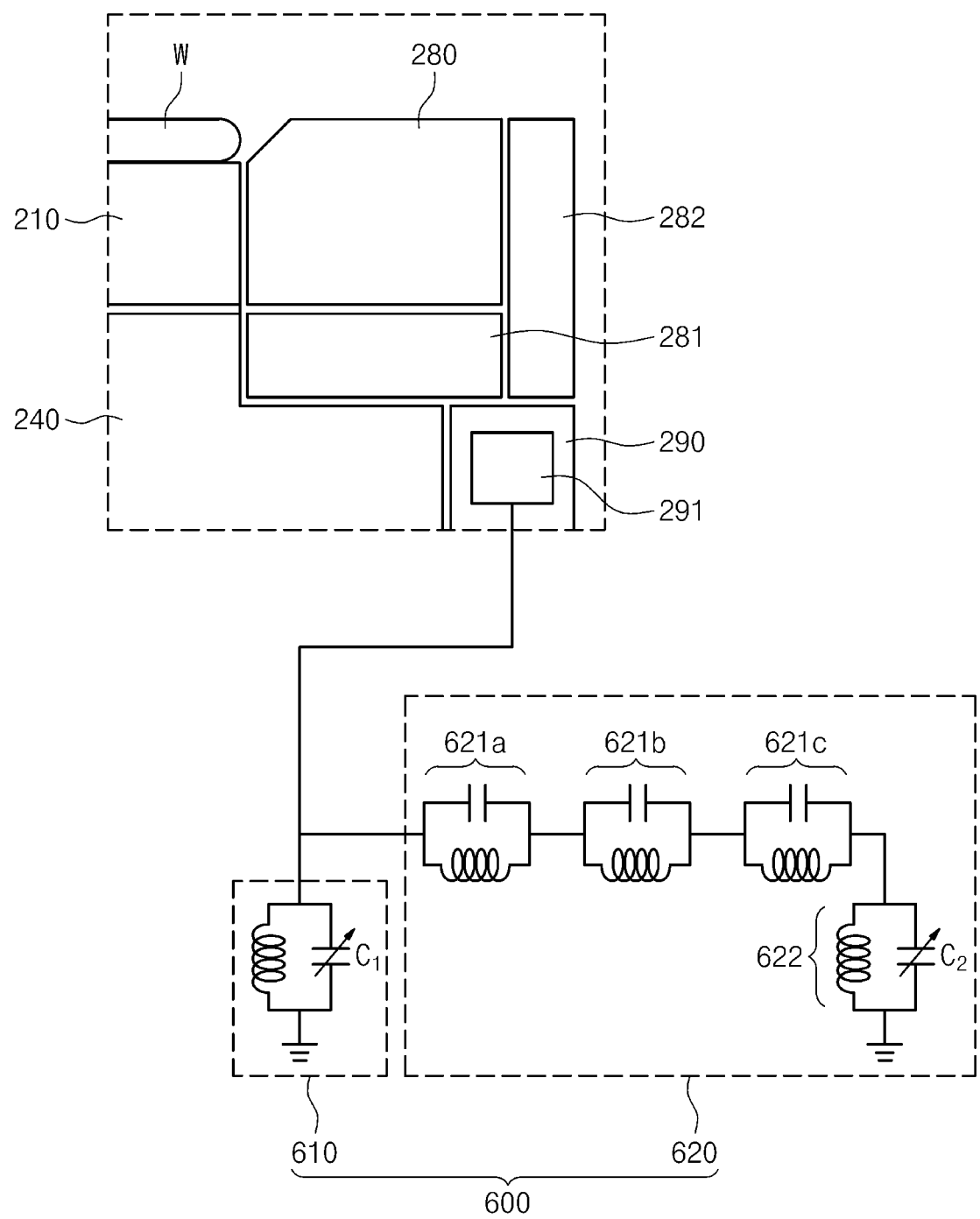
FIG. 4 is a diagram showing an edge impedance control circuit according to another embodiment of the inventive concept.

FIG. 4 is a diagram showing the edge impedance control circuit 600 according to another embodiment of the inventive concept.

According to the edge impedance control circuit 600 according to an embodiment of FIG. 4, one band stop filter 621c may be further included therein, compared with that of FIG. 3.

According to one embodiment of FIG. 4, a total of three band stop filters 621a, 621b, and 621c may be included therein. The additional band stop filter 621c may additionally block harmonics generated in the plasma in various ranges. According to one example of FIG. 4, the three band stop filters 621a, 621b, and 621c may be configured to block the fundamental frequency (60 MHz) generated from the RF power source, the second harmonic thereof, and the third harmonic thereof, respectively. In this connection, an order in which the band stop filters 621a, 621b, and 621c are arranged may be configured such that the band stop filter for blocking a frequency having the greatest influence may be the closest to the electrode 291.

Figure 5:
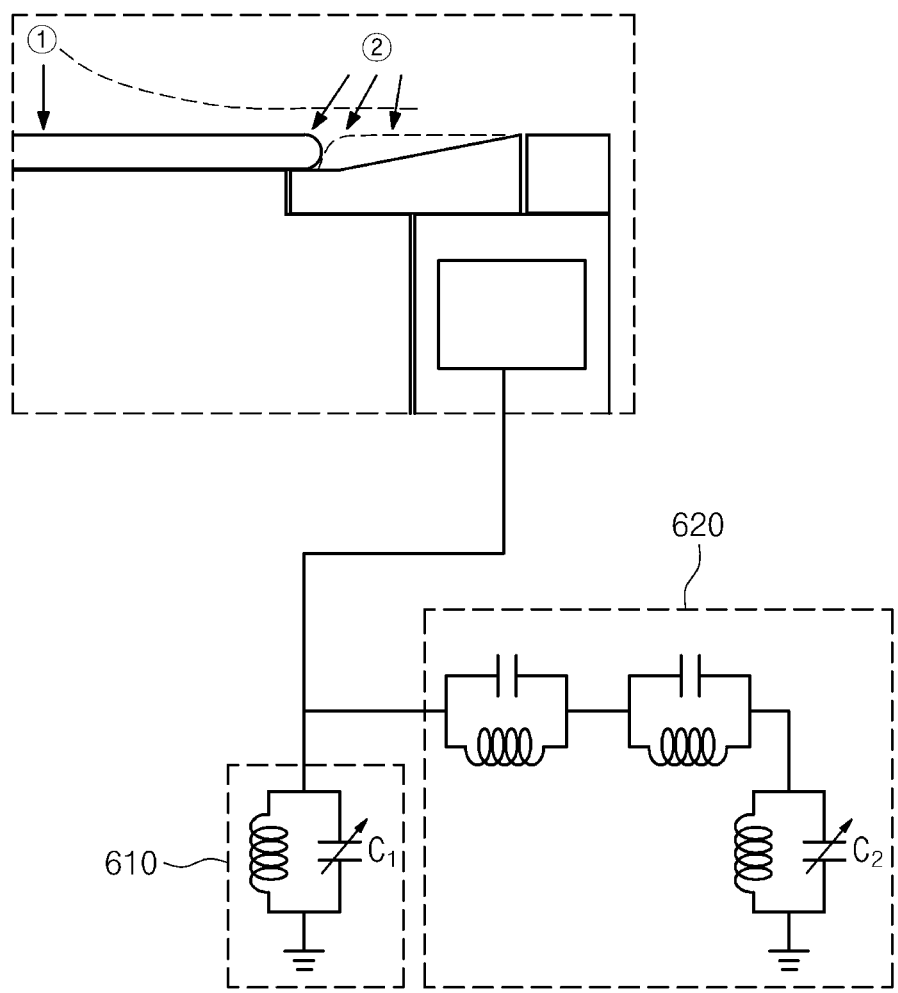
FIG. 5 is a diagram to illustrate a result obtained by using an edge impedance control circuit according to the inventive concept.

FIG. 5 is a diagram for illustrating a result of using the edge impedance control circuit 600 according to the inventive concept.

According to FIG. 5, a plasma density of a center portion of the substrate W rises due to the third harmonic (180 MHz) of the source power. Further, a curved etching in an edge portion occurs due to change in an ion trajectory of a bias frequency (400 KHz).

The problem as shown in FIG. 5 may be solved using the edge impedance control circuit 600 of the inventive concept. The harmonics control circuit unit 610 included in the edge impedance control circuit 600 may be used to reduce a center peak phenomenon that occurs as shown in ①. The ion flux control circuit unit 620 in the edge impedance control circuit 600 may be used to control the directionality of the ions to lower a rate of the etching of the edge ring 280 which occurs as shown in ②.

Figure 6:
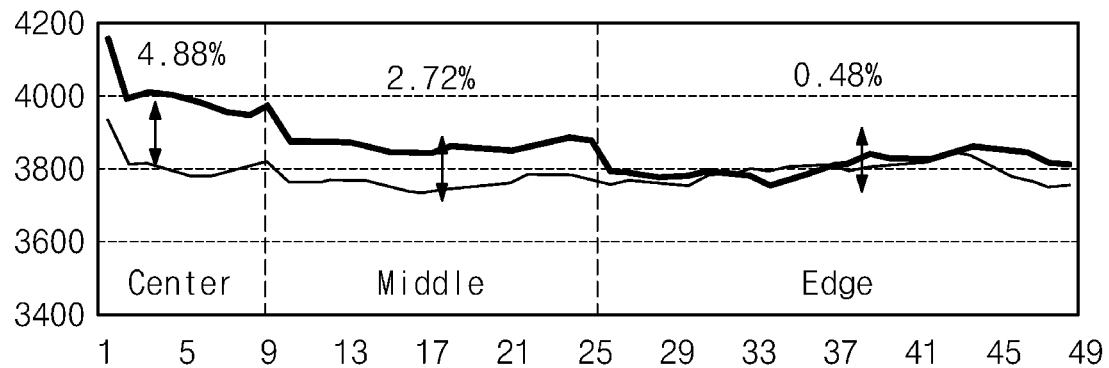
FIG. 6 is a graph comparing a result using an edge impedance control circuit according to an embodiment of the inventive concept with a result using a conventional solution.

FIG. 6 is a graph comparing the result using the edge impedance control circuit 600 according to an embodiment of the inventive concept with a result using the conventional approach.

According to FIG. 6, it may be identified that the center peak phenomenon has been significantly reduced, compared to that in the conventional approach. The edge impedance control circuit 600 according to the inventive concept may be used to perform both of the ion direction control in the edge region and the plasma density control in the central region. Thus, the ion direction control in the edge region in accordance with the inventive concept may increase the use time by about 3 times, compared to that in the conventional approach. Further, the plasma density control in the central region in accordance with the inventive concept may significantly reduce a replacement frequency of the RF cable.

Figure 7:
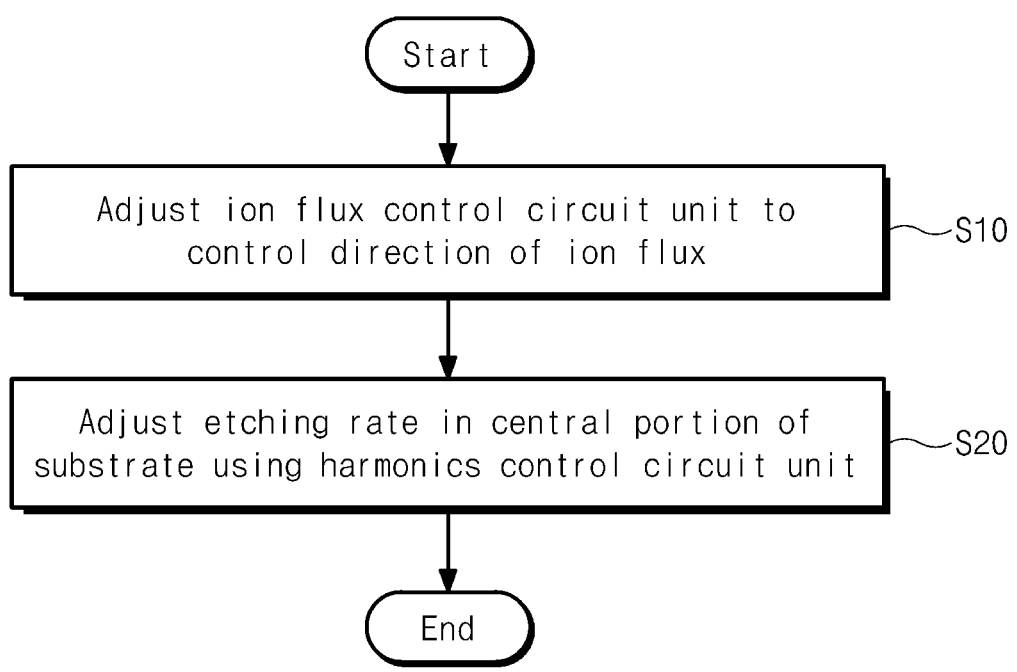
FIG. 7 is a flowchart illustrating a substrate treating method according to an embodiment of the inventive concept.

FIG. 7 is a flowchart illustrating a substrate W treating method according to an embodiment of the inventive concept.

According to FIG. 7, the substrate W treating method according to an embodiment of the inventive concept includes adjusting the ion flux control circuit unit 620 to control the direction of ion flux; and adjusting the etching rate of the central portion of the substrate W using the harmonics control circuit unit 610. In the step of adjusting the ion flux control circuit unit 620 to control the direction of the ion flux, the band stop filter 621 may be used to block the harmonics to remove the influence of the harmonics component generated due to nonlinearity of the plasma sheath. In this connection, the blocked harmonics may have the frequency above or equal to 100 MHz. In the step of adjusting the ion flux control circuit unit 620 to control the direction of the ion flux, the direction of the ion flux may be adjusted by controlling the second variable capacitor C2. In the step of controlling the etching rate of the central portion of the substrate W using the harmonics control circuit unit 610, the etching rate may be controlled by adjusting the first variable capacitor C1.

According to the inventive concept, etching uniformity may be improved by performing both of the ion direction control and the third harmonic control.

According to the inventive concept, the use time of the edge ring increase to reduce a cost thereof.

Effects of the inventive concept are not limited to the above-mentioned effects, and other effects as not mentioned will be clearly understood by those skilled in the art from the above descriptions.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate treating apparatus comprising:
   a process chamber having a treating space defined therein;
   a support unit for supporting a substrate in the treating space, wherein the support unit includes a lower electrode;
   a gas supply unit for supplying process gas into the treating space;
   an RF power source connected to the lower electrode for supplying an RF signal to excite the process gas to a plasma state; and
   a lower RF power source connected to the lower electrode of the support unit,
   wherein the support unit further includes:
   an edge ring surrounding the substrate;
   a coupling ring disposed below the edge ring and including a coupling ring electrode therein; and
   an edge impedance control circuit connected to the coupling ring electrode,
   wherein the edge impedance control circuit includes:
   a harmonics control circuit unit directly connected to the coupling ring electrode with an electrical wire for controlling harmonics caused by the RF power source; and
   an ion flux control circuit unit directly connected to the coupling ring electrode with the electrical wire for controlling an ion flux in an edge region of the substrate,
      wherein the harmonics control circuit unit and the ion flux control circuit unit are connected in parallel to the coupling ring electrode,
   wherein the harmonics control circuit unit includes a first variable capacitor,
   wherein the ion flux control circuit unit includes a second variable capacitor,
   wherein the first variable capacitor of the harmonics control circuit unit is configured to control a third harmonic caused by the RF power source,
   wherein the second variable capacitor of the ion flux control circuit unit is configured to control an impedance of the edge ring such that an ion trajectory is uniform,
   wherein the ion flux control circuit unit further includes:
   a plurality of band stop filters connected in series between the coupling ring electrode and a ground, each of the plurality of band stop filters having a fixed capacitor, and
   a circuitry disposed between the ground and the plurality of band stop filters and having the second variable capacitor so that each of the plurality of band stop filters and the circuitry are connected in series between the coupling ring electrode and the ground,
   wherein one of the plurality of band stop filters most adjacent to the coupling ring electrode among the plurality of band stop filters is configured to block a frequency range of the third harmonic generated from the RF power source, and
   wherein other band stop filters of the plurality of band stop filters are configured to block frequency ranges of harmonics, other than the third harmonic, generated from the RF power source.

2. The substrate treating apparatus of claim 1, wherein the harmonics control circuit unit is closer to the coupling ring electrode than the ion flux control circuit unit is.

3. The substrate treating apparatus of claim 2, further comprising:
   an insulator disposed between the edge ring and the coupling ring.

4. A substrate treating apparatus comprising:
   a process chamber having a treating space defined therein;
   a support unit for supporting a substrate in the treating space, wherein the support unit includes a lower electrode;
   a gas supply unit for supplying process gas into the treating space;
   an RF power source connected to the lower electrode for supplying an RF signal to excite the process gas to a plasma state; and
   a lower RF power source connected to the lower electrode of the support unit,
   wherein the support unit includes:
   an edge ring surrounding the substrate;
   a coupling ring disposed below the edge ring and including a coupling ring electrode therein;
   a harmonics control circuit unit including a first variable capacitor and directly connected to the coupling ring electrode with an electrical wire; and
   an ion flux control circuit unit including a second variable capacitor and directly connected to the coupling ring electrode with the electrical wire,
      wherein the harmonics control circuit unit and the ion flux control circuit unit are connected in parallel to the coupling ring electrode,
   wherein the ion flux control circuit unit includes at least one band stop filter disposed between the harmonics control circuit unit and the second variable capacitor,
   wherein the first variable capacitor of the harmonics control circuit unit is configured to control a third harmonic caused by the RF power source, and
   wherein the second variable capacitor of the ion flux control circuit unit is configured to control an impedance of the edge ring such that an ion trajectory is uniform,
   wherein the ion flux control circuit unit further includes:
   a plurality of band stop filters connected in series between the coupling ring electrode and a ground, each of the plurality of band stop filters having a fixed capacitor, and a circuitry disposed between the ground and the plurality of band stop filters and having the second variable capacitor so that each of the plurality of the band stop filters and the circuitry are connected in series between the coupling ring electrode and the ground, wherein one of the plurality of band stop filter most adjacent to the coupling ring electrode among the plurality of the plurality of band stop filters is configured to block a frequency range of the third harmonic generated from the RF power source, and wherein other band stop filters of the plurality of band stop filters are configured to block frequency ranges of harmonics, other than the third harmonic, generated from the RF power source.

5. The substrate treating apparatus of claim 4,
wherein a distal end of the harmonics control circuit unit is connected to the ground,
wherein the harmonics control circuit unit is connected in parallel with the ion flux control circuit unit.

6. The substrate treating apparatus of claim 5,
wherein a distal end of the ion flux control circuit unit is connected to the ground.

7. The substrate treating apparatus of claim 6,
wherein a frequency blocked by the at least one band stop filter blocks is 60 MHz or 180 MHz.

8. The substrate treating apparatus of claim 7,
wherein each of the harmonics control circuit unit and the ion flux control circuit unit is electrically connected to the coupling ring electrode.

9. The substrate treating apparatus of claim 8, further comprising:
an insulator disposed between the edge ring and the coupling ring.

* * * * *